United States Patent [19]

Whiteside

[11] 4,431,987

[45] Feb. 14, 1984

[54] ANALOG-TO-DIGITAL AND DIGITAL-TO-ANALOG CONVERTERS AND METHODS OF OPERATION

[75] Inventor: Arliss E. Whiteside, Royal Oak, Mich.

[73] Assignee: The Bendix Corporation, Southfield, Mich.

[21] Appl. No.: 352,509

[22] Filed: Feb. 25, 1982

Related U.S. Application Data

[62] Division of Ser. No. 134,600, Mar. 27, 1980, Pat. No. 4,333,075.

[51] Int. Cl.³ .......................................... H03K 13/02
[52] U.S. Cl. ..................... 340/347 DA; 340/347 AD; 340/347 M
[58] Field of Search ... 340/347 M, 347 DA, 347 AD, 340/347 CC

[56] References Cited

U.S. PATENT DOCUMENTS

| | | | |
|---|---|---|---|
| 3,588,881 | 2/1971 | Gordon | 340/347 AD |
| 3,745,555 | 6/1973 | Carbrey | 340/347 AD |
| 3,790,910 | 2/1974 | McCormack | 364/558 |
| 3,936,819 | 2/1976 | Angelle et al. | 340/347 AD |

OTHER PUBLICATIONS

Schmid, Electronic Analog/Digital Conversions, Van Nostrand Reinhold Co., 1970, pp. 247-256.
The Engineering Staff of Analog Devices, Inc., Analog-Digital Conversion Handbook, 6/72, pp. I-64 & i-65.

Primary Examiner—T. J. Sloyan
Attorney, Agent, or Firm—James R. Ignatowski; Russel C. Wells

[57] ABSTRACT

A method and apparatus for converting between analog signals and corresponding digital signals that is accurate relative to the actual value of the input signal, and not relative to the upper limit on the analog input signal. The method and apparatus are disclosed in terms of a serial-feed-back A/D converter that performs an A/D conversion through a plurality of cycles equal in number to the number of bits in the digital output word. In each cycle a comparison voltage is tested to determine if the bit output for the cycle is high or low. The comparison voltage is the amplified difference of the comparison voltage for the preceding cycle and another reference signal. The scale factor for the amplification of the difference between the two signals is one value if the bit value for the preceding cycle was high, and another complementary value if the bit value for the preceding cycle is low. The companion method and apparatus for converting a non-binary digital signal into a corresponding analog signal is also disclosed.

24 Claims, 8 Drawing Figures

ANALOG-TO-DIGITAL AND DIGITAL-TO-ANALOG CONVERTERS AND METHODS OF OPERATION

This is a division of application Ser. No. 134,600, filed Mar. 27, 1980, U.S. Pat. No. 4,333,075.

TECHNICAL FIELD

The present invention relates to analog-to-digital (A/D) and digital-to-analog (D/A) conversion devices, and more particularly to conversion devices that have a converted output that is accurate relative to the actual value of the input signal.

BACKGROUND ART

An analog-to-digital conversion device receives an analog input signal and converts it into a corresponding digital output signal having a predetermined number of digital bits. The accuracy of such a conversion device is normally rated in terms of a percentage of the full-scale of the input signal.

In many instances it is important to know the accuracy of the digital output signal relative to the actual value of the input signal, not the nominal full-scale value of the input signal. A specific example is an A/D converter which has a full-scale input signal of ten (10) volts and an actual input signal of one (1) volt, with a required accuracy of one percent (1%) relative to the actual input value. In this case, the output value must be accurate to within 10 millivolts to satisfy the requirement of accuracy with respect to the actual input value. If the converter were one percent (1%) accurate relative to the full-scale input value, the accuracy of the output would only be within 100 millivolts.

There are a number of engineering applications where it is desirable that the output of the converter be accurate relative to the actual input value, not the full-scale input value. An example is in an automotive fuel injection system where the fuel-to-air ratio of the injected mixture must be accurate to within a precise tolerance. The fuel injected is based upon a measurement of the air flow, and this air flow must be accurately conveyed to the fuel control computer. A deviation beyond this precise tolerance can cause a marked falloff in fuel efficiency and diminish the effectiveness of anti-pollution equipment.

An objective, therefore, of the present invention is to provide conversion devices and associated methods of operation that perform a conversion relative to the actual value of the input signal, and not the full-scale value. In particular, the object of the invention is an analog-to-digital converter and its companion digital-to-analog converter accurate relative to the actual value of the received signal.

DISCLOSURE OF THE INVENTION

In summary, the present invention is a conversion device and associated method of operation that converts analog input signals into a corresponding digital output words, or vice versa, that is accurate relative to the actual value of the input signal.

The invention is well adapted for use with serial-feedback A/D and D/A conversion devices. A serial-feedback A/D converter generally performs an A/D conversion through a plurality of cycles equal in number to the number of bits in the digital output word. In each cycle a comparison voltage is compared against a reference voltage to determine if the bit output for the cycle is to be a binary one or zero. The comparison voltage for each cycle is the amplified difference between the comparison voltage for the immediately preceding cycle and another reference voltage that is a function of the value of the output bit from the immediately preceding cycle. Specifically, if the preceding output bit was high, then this reference voltage is high, and if the preceding output bit was low, then it is low. Initially, the comparison voltage for the first cycle is the analog input signal instead of the amplified difference voltage from the immediately preceding cycle. After the comparison voltage is determined and compared against the first-mentioned reference voltage, it is stored for use in the next succeeding cycle. The serial-feedback digital to analog converter operates in a complementary manner.

In conventional operation of a serial-feedback converter, the first and second-mentioned reference voltages are equal to one-half of the full scale analog input value. This relationship constrains the conversion device to be accurate relative to the full-scale input value of the device, not the actual value of the analog input signal.

The present invention affords flexibility in the selection of the accuracy of the converter based on a priori knowledge of the actual range of values of the input signal. Specifically, a bit weight constant, k, is selected to scale down the weight of each bit in the digital output word to increase the resolution of the coverter for small input values. In a binary converter accurate relative to full scale, $k=\frac{1}{2}$, but in accordance with the present invention k is selected from the range $0<k<\frac{1}{2}$.

In practical effect, the selection of k redefines the first and second-mentioned reference voltages, as well as the analog weight of each bit in the digital output word. The amplification factor used to obtain the comparison voltage now becomes a different function of k depending on the value of the previous output or received input bit. the weight of each bit in the digital output word now corresponds to a smaller range of analog values, providing greater resolution for each bit position. The selection of a specific k as a function of the actual range of values of the analog input or output signal will determine the accuracy of the output relative to the actual input signal.

The digital output or input word, as modified in terms of selection of a specific k, can be correlated with an equivalent digital word in binary digital code. An advantageous method of correlating the digital words is through a look-up table containing a set of digital words, where each word in the set has an address defined in terms of its equivalent digital word in the other digital code.

Other advantages of the present invention will be readily appreciated as the same becomes better understood by reference to the following detailed description when considered in connection with the accompanying drawings.

DETAILED DESCRIPTION OF A PREFERRED EMBODIMENT OF THE INVENTION

I. Introduction

The present invention relates to non-binary analog-to-digital and digital-to-analog conversion devices and associated methods for converting an analog input signal into a corresponding digital output word, and vice versa, that is accurate relative to the actual value of the input signal and not relative to a predetermined full scale input value. The invention will hereafter be explained by first describing a conventional single-amplifier circulation A/D converter. This is followed by a description of a single-amplifier circulation A/D converter that has been modified in accordance with the present invention, to produce a digital output that is accurate relative to the actual analog input. A description of a generic model of a serial-feedback A/D converter is also provided. This is followed by a description of the corresponding D/A converter.

II. A Conventional Binary A/D Converter

Figure 1:
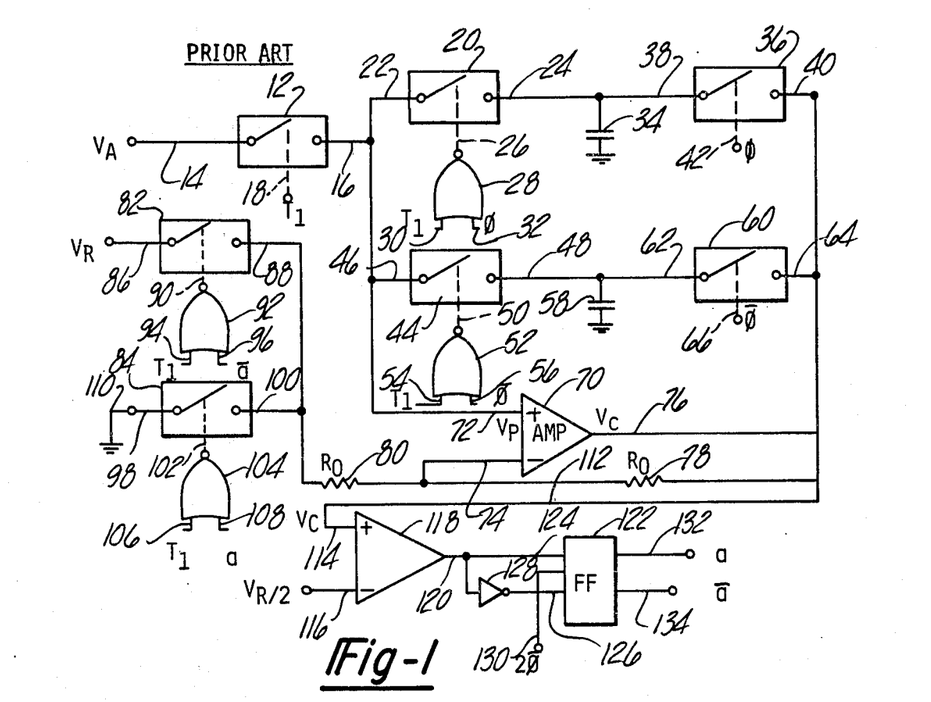
FIG. 1 is a schematic of a single-amplifier circulation A/D converter as is known in the prior art.

FIG. 1 is a schematic of a conventional single-amplifier circulation binary A/D converter. The A/D converter receives an analog input signal $V_A$ and converts it through a process of n repetitive cycles into an n-bit binary digital output word. The conventional A/D converter is illustrated and described in H. Schmid, *A/D Converters, Part* 1, *Electronic Design* 25, pp. 58–62, Dec. 5, 1968.

Figure 5:
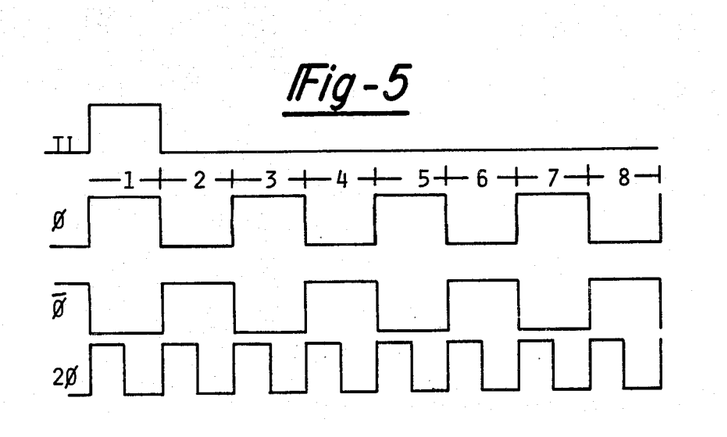
FIG. 5 is a timing diagram illustrating the timing signals used in the converters of FIGS. 1, 2, 3, and 7.

The A/D converter includes a voltage-controlled analog switch 12. The switch 12 has an input terminal 14 which receives an analog input voltage $V_A$, and an output terminal 16 that receives the signal on terminal 14 depending upon whether the switch is closed or open. A control terminal 18 receives a control signal $T_1$ that controls the opening and closing of switch 12. The signal $T_1$ is shown in FIG. 5 as a timing signal that is high during an initial clock period representing the first of repetitive conversion cycles, and low at all other times thereafter. The switch 12 will be closed when $T_1$ is high, and open when $T_1$ is low.

Another voltage-controlled analog switch 20 has one terminal 22 connected to the terminal 16 of switch 12, and another terminal 24. A control terminal 26 carries a signal that controls the opening and closing of the switch 20. The signal appearing on control terminal 26 is the output signal from a NOR gate 28. The NOR gate 28 has a first input 30 that receives the initial timing signal $T_1$, and a second input 32 that receives a clock signal $\phi$. The periodic clock signal $\bar{\phi}$ and its inverse $\phi$ are generated in the manner disclosed in the cited Schmid article and shown in FIG. 5. The periodic timing signal $\phi$ is alternately high and low during two successive timing periods.

The output signal from NOR gate 28 will be high only when both signals $T_1$ and $\phi$ are low; at all other times the NOR gate output will be low. Stated otherwise, the output will be high during every second timing period beginning with the second timing period. The switch 20 will be closed when the output of NOR gate 28 is high, and open when the output is low. In an alternative embodiment, the switch 20 could be controlled by the direct application of the inverse clock signal $\bar{\phi}$ to the control terminal 26. The illustrated embodiment has been chosen to maintain consistency with the Schmid article, and, hence, the NOR gate 28 has been retained.

A capacitor 34 is connected between ground and the switch terminal 24. The capacitor 34, as will hereinafter be explained, either charges or discharges during each succeeding two timing periods beginning with the first timing period.

Another voltage-controlled analog switch 36 has one terminal 38 connected to the common terminus of output terminal 24 and capacitor 34. Another terminal 40 communicates with the terminal 38 depending upon whether the switch is closed or open. A control terminal 42 receives the periodic timing or clock signal $\phi$. When $\phi$ is high, the switch 36 is closed and when low the switch is open.

Another voltage-controlled analog switch 44 has one terminal 46 that is connected to the terminal 16 of switch 12, and another terminal 48 that is in communication with the terminal 46 depending upon whether the switch is closed or open. A control terminal 50 receives a signal that controls the condition of the switch 44. The signal on the control terminal 50 is the output of a NOR gate 52. The NOR gate 52 has a first input 54 that receives the initial timing signal $T_1$, and a second input terminal 56 that receives the inverted periodic clock or timing signal $\bar{\phi}$. The output signal of NOR gate 52 will be high during every second timing period beginning with the third time period, and low at all other times. When the output signal from NOR gate 52 is high, the switch 44 is closed, and when low the switch is open.

A capacitor 58 is connected between the switch output terminal 48 and ground. The capacitor 58, as will hereinafter be described, will charge or discharge during each two successive timing periods beginning with the second period.

Another voltage-controlled analog switch 60 has one terminal 62 that is connected to the common terminus of terminal 48 and capacitor 58, and another terminal 64 that communicates with the terminal 62 depending upon whether the switch is closed or open. A control terminal 66 receives the inverted clock or periodic timing signal $\bar{\phi}$. When the inverted clock signal $\bar{\phi}$ is high, the switch 60 is closed, and when low, the switch is open.

An operational amplifier 70 has a positive input 72 and a negative input 74. The amplifier 70 produces a signal on its output terminal 76 that is the highly amplified difference of the signals appearing on the positive terminal 72 and the negative terminal 74. The output terminal 76 is connected to the terminal 64 of switch 60 and the terminal 40 of switch 36. The positive input terminal 72 of amplifier 70 is connected to the common terminus of terminal 16 of switch 12, terminal 22 of switch 20 and terminal 46 of switch 44.

A resistor 78 having a resistance value $R_0$ is connected between the amplifier output terminal 76 and the negative input terminal 74. Another resistor 80 having the same resistance value $R_0$ has one terminal connected to the common terminus of the resistor 78 and negative input terminal 74, and another terminal connected in common with the outputs of another pair of voltage-controlled analog switches 82 and 84. The resistors 70 and 78 form a voltage divider network that defines the gain of the operational amplifier 70. In conventional design the resistors 78 and 80 will have the same resistance value $R_0$ and will provide an amplifier gain of two (2) when either of switches 82 and 84 is closed.

The one voltage-controlled analog switch 82 has an input terminal 86 that receives a reference voltage, $V_R$ that represents the nominal upper limit or full-scale value of the analog input signal $V_A$. An output terminal 88 receives the signal on the input terminal 86 depending upon whether the switch 82 is closed or open. A control terminal 90 receives a signal that controls the condition of the switch. The signal on the control terminal 90 is the output of a NOR gate 92. The NOR gate has a first input 94 that receives the initial timing signal $T_1$, and a second input 96 that receives the inverse of the bit value for the immediately preceding conversion cycle, $\overline{a}$. The output of the NOR gate 92 will be low during the initial timing cycle, and will thereafter be high only when the output bit for the immediately preceding cycle was high. When the signal on the control terminal 90 is high, the switch 82 is closed and when low the switch is open.

The other voltage-controlled analog switch 84 has an input terminal 98 that is connected to ground through line 110. An output terminal 100 communicates with the input terminal 98 depending upon whether the switch is closed or open. A control terminal 102 receives a control signal that governs the condition of the switch 84. The control signal is the output of a NOR gate 104. The NOR gate 104 has a first input 106 that receives the initial timing signal $T_1$ and a second input that receives the non-inverted value of the output bit, a, for the immediately preceding cycle. The output signal of the NOR gate 104 will be low during the initial timing period, and thereafter be high only when the output bit for the immediately preceding cycle was low.

A comparator 118 has a positive input terminal 114 and a negative input terminal 116. The positive input terminal 114 is connected by a line 112 to the output terminal 76 of the operational amplifier 70. The negative input terminal 116 receives a reference voltage of $V_R/2$. The comparator 118 produces a signal on its output terminal 120 that is high when the signal on its positive input terminal 114 exceeds $V_R/2$, and produces a low output when $V_R/2$ is greater than the signal on the positive input terminal.

A J-K flip-flop 122 has a J input terminal 124, and a K input terminal 126. The J input 124 receives directly the signal appearing on the output terminal 120 of comparator 118, and the K input 126 receives the inverse of the same signal through an inverter 128. The flip-flop 122 has a clock input 130, and is clocked on the falling edge of the multiplied inverted clock signal $2\overline{\phi}$. The flip-flop 122 has an a output terminal 132, and a $\overline{a}$ output terminal 134 that represents, respectively, the asserted and inverted values of the single-bit output for the present conversion cycle.

A description of the operation of the single-amplifier circulation A/D converter of FIG. 1 will next be given to provide an overview of how an analog input signal $V_A$ is converted into a corresponding n-bit digital output word through a sequence of n conversion cycles. Operation of the A/D converter 10 begins during the initial timing period $T_1$ during which the switches 12 and 36 are closed, and the switches 20, 44, 60, 82 and 84 are open. Since the switches 82 and 84 are open, the operational amplifier 70 functions as a unity-gain voltage follower. The output voltage $V_C$ of the amplifier 70 is, therefore, equal to the voltage $V_P = V_A$ appearing on its positive input terminal 72.

The voltage appearing on the output terminal 76 of the amplifier 70 is hereinafter referred to as a comparison voltage $V_C$. The comparison voltage $V_C$ is communicated by way of line 112 to the positive input terminal 114 of the comparator 118. The negative input terminal 116 receives one-half of the reference voltage $V_R$. If the comparison voltage $V_C$ exceeds $V_R/2$, then a high level signal appears on the output terminal 120. If the converse is true, a low level signal appears on the output terminal 120.

The J-input terminal 124 of the flip-flop 122 receives directly the signal appearing on comparator output terminal 120. The K-input terminal 126 receives the inverse of the signal on output terminal 120 through an inverter 128. If the signal value appearing on output terminal 120 is high, the bit value for this conversion cycle is high, and complementary high and low signals will appear on the flip-flop output terminals 132 and 134, respectively. Conversely, if the comparison voltage $V_C$ is less than $V_R/2$, the signal on output terminal 120 will be low, indicating that the output bit a for this cycle is low, and complementary low and high signals will appear on the flip-flop output terminals 132 and 134, respectively.

The comparison voltage $V_C$ is also applied to the capacitor 34 through closed switch 36. The capacitor 34 stores the comparison voltage $V_C$ from the present cycle for use in the next succeeding cycle.

During the second timing period, either switch 82 (if $\overline{a}_1 = 0$), or switch 84 (if $a_1 = 0$) is closed, together with switches 20 and 60. Switches 12, 36 and 44 are open. The closure of switch 20 will cause capacitor 34 to be connected through the switch to the positive input terminal 72 of the operational amplifier 70. Accordingly, the positive input voltage $V_P$ will be the stored voltage on the capacitor 34.

The voltage $V_N$ on the negative input terminal 74 of amplifier 70 is determined by the voltage divider resistors 80 and 78, from the voltage provided by either switch 82 or 84 and the comparison voltage $V_C$ on output terminal 76. Since the resistors 80 and 78 are equal, the voltage will be $V_N = \frac{1}{2}(V_C + V_R)$ if switch 82 is closed. The operational amplifier 70 operates to make its positive and negative input voltages, $V_P$ and $V_N$, essentially equal, thus producing in this case:

$$\tfrac{1}{2}(V_C + V_R) = V_P$$

or $$V_C = 2(V_P - \tfrac{1}{2}V_R)$$

If switch 84 is closed instead, the voltage produced will be $V_N = \frac{1}{2}(V_C + 0)$. In this case, the operational amplifier 70 will produce:

$$V_C/2 = V_P$$

or $$V_C = 2V_P$$

The comparison signal $V_C$ is communicated through closed switch 60 to the capacitor 58, which charges up to $V_C$. The comparison signal $V_C$ is also communicated by way of line 112 to the positive input terminal 114 of the comparator 118. A comparison is then again made for this conversion cycle between the magnitude of the comparison signal $V_C$ and one-half of the reference signal, $V_R/2$. The output bit a will be high if $V_C$ exceeds $V_R/2$ and low if the converse is true.

During the third and subsequent timing periods, operation is similar to that during the second timing period. However, the roles of switch 20, switch 60, and capacitor 58 alternate with the roles of switch 44, switch 36 and capacitor 34, respectively.

In general, the single-amplifier circulation A/D converter converts the analog input signal $V_A$ into an n-bit digital output word through a sequence of n conversion cycles. In each coversion cycle a comparison voltage $V_C$ is compared against one-half of the upper limit or full scale value of the analog input signal. The comparison voltage is twice the difference between the comparison voltage from the immediately preceding cycle and a reference signal that has a value dependent upon the condition of the output bit from the imediately preceding cycle.

III. The A/D Converter of the Present Invention

Figure 2:
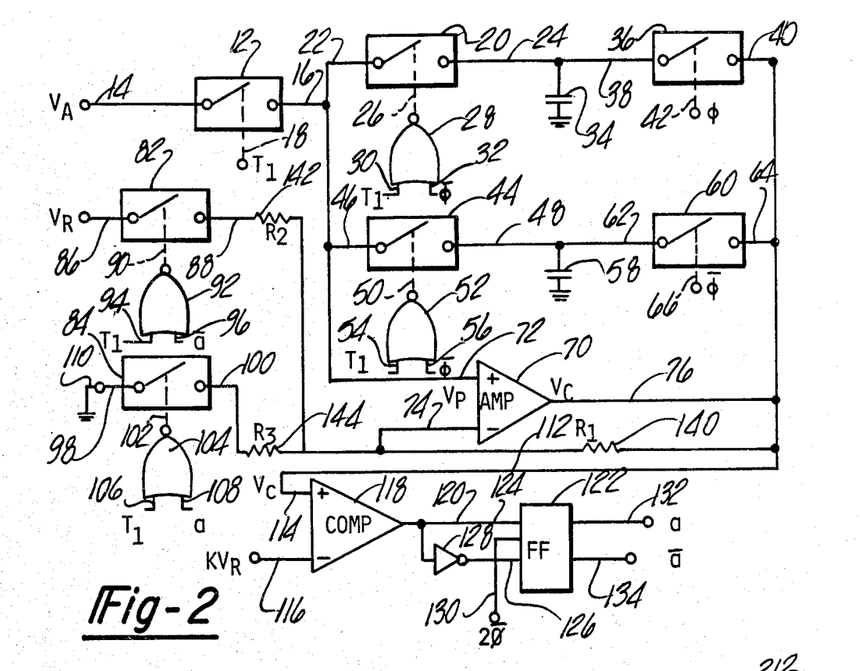
FIG. 2 is a schematic of a single-amplifier circulation A/D converter modified from the converter design of FIG. 1 to incorporate the present invention.

An A/D converter of the present invention can be realized by a modification of the circuitry of the serial-amplifier circulation A/D converter shown in FIG. 1. FIG. 2 is a schematic of a single-amplifier circulation A/D converter modified in accordance with the present invention. The modified A/D converter converts an analog input signal $V_A$ into a corresponding non-binary digital output word that is accurate relative to the actual value of the analog input signal, and not relative to the full scale or upper limit on the value of $V_A$.

The modified A/D converter of FIG. 2 is in major detail structurally similar to the A/D converter of FIG. 1. All like elements in the modified A/D converter 10' are assigned a similar reference numeral. Only those elements which have been modified differ in reference numeral designation.

The A/D converter has been significantly modified in respect to the voltage divider circuit that defines the gain of the operational amplifier 70. The gain of amplifier 70 and the selection of the resistance values for the voltage divider network connected to the negative input terminal 74 are a function of a preselected bit weight constant k.

The bit weight constant k is $\frac{1}{2}$ in a conventional binary A/D converter, but is now selected from the range of $0 < k < \frac{1}{2}$. In effect, the selection of a k less than $\frac{1}{2}$ reduces the effective analog weight of each bit position making it non-binary and increases the resolution of the modified converter. The selection of a specific k is a function of a priori knowledge of the range of the analog input signal $V_A$, and desired precision throughout the range of $V_A$. In fact, it is within the scope of the present invention to use more than one value of k through successive conversion cycles.

The voltage divider circuit coupled to the negative input terminal 74 of the operational amplifier 70 comprises resistors 140, 142, and 144. The resistor 140 has a resistance value of $R_1$ and is connected between the amplifier output terminal 76 and the negative input terminal 74. The resistor 142 has a resistance value of $R_2$ and has one terminal connected to the common terminus of resistor 140 and negative input terminal 74, and another terminal connected to the output terminal 88 of the switch 82. Resistor 144 has a resistance value of $R_3$ and has one terminal connected to the common terminus of resistor 140 and negative input terminal 74, and another terminal connected to the output terminal 100 of switch 84.

During the first timing period $T_1$, both switches 82 and 84 will be open, and the amplifier 70 will have a gain of unity. However, during each successive timing period, one or the other of the switches 82 and 84 will be closed in mutually exclusive relation. When switch 82 is closed, resistors 140 and 142 form the voltage divider network that defines the gain of the operational amplifier 70; resistor 144 is effectively disconnected from the network. When switch 84 is closed, resistors 140 and 144 form the voltage divider network that defines the gain of the amplifier 70; resistor 142 is effectively disconnected from the network.

The resistance values R2 and R3 for resistors 142 and 144, respectively, are determined by selecting the resistance value $R_1$ for resistor 140 and the bit weight constant, k. The following relationship holds between the resistance values:

$$R_2 = ((1-k)/k)R_1$$

$$R_3 = (k/(1-k))R_1.$$

The resistor circuit as thus defined causes the gain of the amplifier 70 to be a function of the condition or level of the output bit from the immediately preceding cycle. More specifically, when the output bit a from the preceding cycle is high, the comparison voltage is expressed as follows:

$$V_C = (1/(1-k))(V_P - kV_R),$$

When the output bit a from the preceding cycle is low, the comparison voltage is defined by the following expression:

$$V_C = (1/k)V_P.$$

In addition to modification of the resistor network connected to the negative input terminal 74 of amplifier 70, the reference voltage applied to the negative input terminal 116 of the comparator 118 is also modified. Specifically, the reference voltage is now $kV_R$, instead of $\frac{1}{2}V_R$.

The following is a comparison between the prior art binary analog-to-digital converter and the disclosed non-binary analog-to-digital converter. Consider a simple conversion of an analog signal having a value of 3.0 volts within a full scale range of 10 volts.

With the prior art binary converter the resultant 6-bit fractional binary code would be 010011 which represents a numerical value 2.97 volts. The resultant error is 0.3% of full scale range. However with respect to the input signal the error is or 1.0%.

Now considering the disclosed analog to digital converter where the reference voltage $V_R = 10$ volts and k is selected to have a value equal to ¼.

During the initial timing cycle period $T_1$, switches 12 and 36 are closed, and switches 20, 44, and 60, 82 and 84 are open. The analog input signal $V_A$ is applied through the switch 12 to the positive input terminal 72 of the operational amplifier 70. Because switches 82 and 84 are open, the amplifier 70 functions as a unity-gain voltage follower. Accordingly, $V_P = V_C = V_A = 3.0$ volts the voltage $V_C$ being the comparison voltage.

The comparison voltage $V_C$ is supplied by way of line 112 to the positive input terminal 114 of comparator 118. The signal applied to the negative input terminal 116 is $kV_R = (¼)(10) = 2.5$ v. In this instance, the comparison is favorable, i.e. 3 volts $\geq 2.5$ volts, and the output bit for the first conversion cycle is high or a binary one. This is the most significant bit in the digital output word, and it is to be noted that it has an equivalent analog weight of 2.5 volts, rather than five volts as would be the case with a conventional binary converter.

The comparison voltage for the first conversion cycle is stored on the capacitor 34 as a result of the closure of the switch 36. The voltage stored by the capacitor 34 will serve as the positive input voltage $V_P$ for the second conversion cycle.

During the second timing period, switches 20, 60 and 82 are closed, and switches 12, 36, 44 and 84 are open. The closure of the switch 20 causes the voltage stored on the capacitor 34 to be connected through the switch 20 to the positive input terminal 72 of the operational amplifier 70. In the second conversion cycle $V_P = 3.0$ volts, which was the comparison voltage for the immediately preceding cycle. The output bit for the preceding conversion cycle was high, and, accordingly, the comparison voltage $V_C$ is defined by the following previously-derived expression:

$$V_C = (1/(1-k))(V_P - kV_R).$$

In terms of the present example, the comparison voltage $V_C$ now equals ⅔ volt.

The comparison voltage $V_C$ appearing on amplifier output terminal 76 is communicated through switch 60 to the capacitor 58, which charges to store the comparison voltage for the next succeeding cycle.

During the third timing period, switches 44, 36, and 84 are closed, and switches 12, 20, 60, and 82 are open. The voltage on input terminal 72 of the operational amplifier is $V_P = ⅔$ volts, the comparison voltage from the immediately preceeding cycle. The comparison voltage $V_C$ is given by the following expression:

$$V_C = 1/k(V_P)$$

In the present example, the comparison voltage now equals $8/3 = 2⅔$ volts.

During the fourth timing period switches 20, 60, and 82 are again closed, and switches 12, 36, 44 and 84 are open. The closure of switch 20 causes the voltage stored on the capacitor 34 to be connected through switch 20 to the positive input terminal 72 of the operational amplifier 70. In the fourth conversion cycle $V_P = 2⅔$ volts which was the comparison voltage for the immediately preceding cycle. The output bit for the preceding conversion cycle was high and accordingly the comparison voltage $V_C$ is defined by the expression $$V_C = (1/(1-k))(V_P - kV_R)$$

In the present example, the comparison voltage $V_C$ now equals 2/9 volts. The comparison voltage $V_C$ communicated to the positive input terminal 114 of comparator 118 produces an unfavorable comparison producing a low or binary 0 for the fourth digit.

Carrying out the conversion through 6 stages results in the fractional non-binary digital word 101001. The analog equivalent of this digital word is 2.99 volts as shall be shown in the discussion of the corresponding digital-to-analog converter. Therefore the resultant conversion error of the disclosed non-binary analog-to-digital converter with respect to the input signal is 0.3% which is a significant improvement over the binary converters of the prior art.

Figure 6:
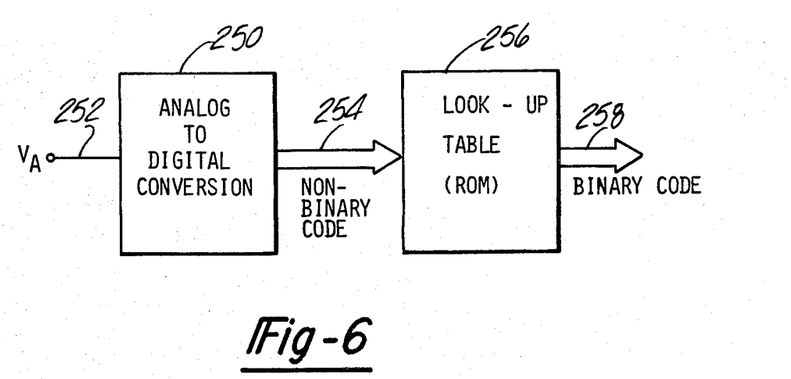
FIG. 6 is a block diagram of an A/D converter of the present invention in conjunction with a look-up table for translating the output of the A/D coverter from non-binary code to binary code.

The resultant digital output word is in a non-binary form. The system designer has a choice of continued processing of the digital output word in this format, or translation of it into a corresponding binary coded digital word. FIG. 6 is a schematic representation of a conjunctive relationship between an analog-to-digital converter 250 of the type illustrated in FIG. 2 and a secondary conversion device 256, as for example a look-up table in a read-only-memory (ROM).

In the operation of FIG. 6, an analog input signal $V_A$ is applied on line 252 to an A/D converter 250. The digital output word on cable 254 is in a non-binary code. The digital output word can be used as an address to access a corresponding binary coded word in the look-up table 256. The corresponding binary coded word can be read out on cable 258 for further processing of the signal. To maintain the precision of the converter for small input values, the binary code 258 would require a greater number of bits than the non-binary code 254.

Moreover the conversion of the non-binary digital word to a binary digital word can also be used to compensate for known errors caused by manufacturing tolerances in A/D converter 250, such as errors in the values resistors $R_1$, $R_2$ and $R_3$ or known error in any subsequent binary digital-to-analog conversion, further improving the accuracy of the system. Where these errors are known, the corresponding binary word addressed by the non-binary word may be modified to reduce any errors that may be encountered. This same method can also be used to correct a non-binary output word to compensate for known errors in the analog to digital conversion. The second conversion device 256 can just as well convert the generated non-binary word to a corrected non-binary word compensated for the known conversion inaccuracies.

IV. A Generic Model of the Present Invention

Figure 3:
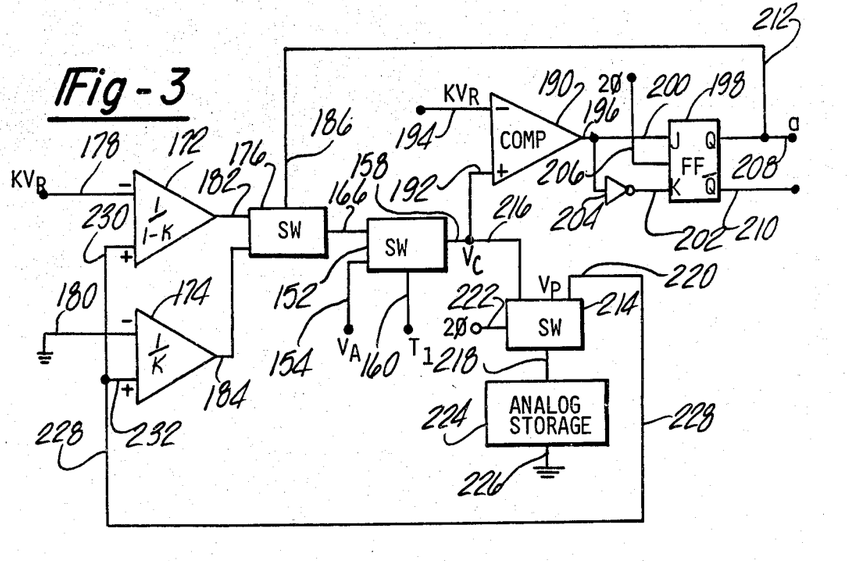
FIG. 3 is a generic model of a serial-feedback A/D converter incorporating the present invention.

FIG. 3 is a generic model of a serial-feedback A/D converter incorporating the present invention. This A/D converter is described in detail as follows.

A voltage-controlled analog switch 152 has a first input terminal 154 which receives the analog input signal $V_A$. A second input terminal receives a signal on line 166 which will function as the comparison voltage for the second and succeeding cycles. The switch 152 has a control terminal 160 that receives the initial timing signal $T_1$. When $T_1$ is high, the switch connects input terminal 154 with output terminal 158; when $T_1$ is low, the input terminal 166 is connected to the output terminal 158. The signal on the output terminal is the comparison voltage $V_C$.

A comparator 190 has a positive input terminal 192 and a negative input terminal 194. The function of the comparator is to compare the signal values on its positive and negative input terminals 192 and 194, respectively, and output a high level signal on terminal 196 if the positive input signal exceeds the negative input signal, and output a low level signal if the converse is true. The positive input terminal 192 is connected to the output terminal 158 of the switch 152, and thereby receives the comparison voltage $V_C$. The negative input terminal receives a fixed reference voltage $kV_R$, i.e. the full-scale analog signal scaled by the bit weight constant k.

A flip-flop or bistable latch 198 has a J-input terminal 200 and a K-input 202. The J-input terminal 200 is directly connected to the output terminal 196 of the comparator 190, and the K-input terminal 202 is connected to output terminal 196 through an inverter 204. The signals appearing on terminals 200 and 202 are by definition mutually opposite from one another. The flip-flop 198 has a control terminal 206 that receives the signal $2\phi$. The flip-flop is triggered on the downward transition of the timing signal $2\phi$.

When the signal level on the J-input terminal 200 is high, the digital output signal on Q-output terminal 208 will become high, and the inverse output or $\overline{Q}$-output terminal 210 will become low. Conversely, when the signal level on J-input terminal 200 is low, the digital output on Q-output terminal 208 will become low, and the digital output on $\overline{Q}$-output terminal 210 will become high. The signals on output terminals 208 and 210 respectively represent the output bit, a, and the inverse of the output bit, $\overline{a}$. The output bit appearing on terminal 208 is communicated by way of line 212 back to the control terminal 186 of another switch 176, for a purpose to be presently described.

A switch 214 has an input terminal 216 that is directly connected to the output terminal 158 of the switch 152 and receives the comparison voltage $V_C$ carried thereon. The switch 214 has a first output terminal 218 that provides an input signal for an analog storage device 224. The analog storage device 224 is normally a capacitor. The analog storage device 224 has one terminal 226 connected to ground.

The switch 214 has another output terminal 220 that communicates its output signal by way of line 228. The signal on line 228 is an analog feedback signal whose use is to be presently described. A control terminal 222 receives the timing signal $2\phi$. When $2\phi$ is high, the switch 214 couples input terminal 216 with terminal 218. When $2\phi$ is low, the switch 214 couples terminal 218 with terminal 220.

A pair of amplifiers 172 and 174 are used to develop the comparison voltage for each conversion cycle beginning with the second. One or the other of the amplifier output signals is chosen depending on the value of the output bit for the preceding conversion cycle.

The amplifier 172 has a positive input terminal 230 which receives the feedback signal on line 228 from the analog storage device 224, and a negative input terminal 178 which receives the scaled upper limit value of the input signal, $kV_R$. The output signal on line 182 of the amplifier 172 is the difference of the applied input signals multiplied by the gain of the amplifier, $1/1-k$, i.e.

$$V_{out}=1/(1-k)(V_P-kV_R),$$

where $V_P$ was the comparison voltage from the preceding cycle stored on the analog storage device 224.

The amplifier 174 has a positive input terminal 232 which receives the feedback signal on line 228, and a negative input terminal 180 which is connected to ground. The output signal on line 184 is the difference of the applied input signals multiplied by the gain of the amplifier, $1/k$, i.e.

$$V_{out}=(1/k)V_P.$$

A switch 176 has as a first input the signal on line 182 and as a second input the signal on line 184. A control terminal 186 receives the Q output signal on line 212 from the flip-flop 198. The Q output signal is the output bit, a, from the preceding conversion cycle. The output signal from the switch 176 is applied as one input to the switch 152. If the bit from the preceding cycle, a, is high, the switch 176 will connect input terminal 182 to output terminal 166; and, if low, the input terminal 184 will be connected to the output terminal.

Accordingly, when the bit a for cycle m is high, the comparison voltage for cycle m+1 will be:

$$V_C=1/(1-k)(V_P-kV_R).$$

When the bit a for cycle m is low, the comparison voltage for cycle m+1 will be:

$$V_C=(1/k)V_P.$$

The operation of the A/D converter of FIG. 3 will next be described in terms of the flowchart of FIG. 4.

Figure 4:
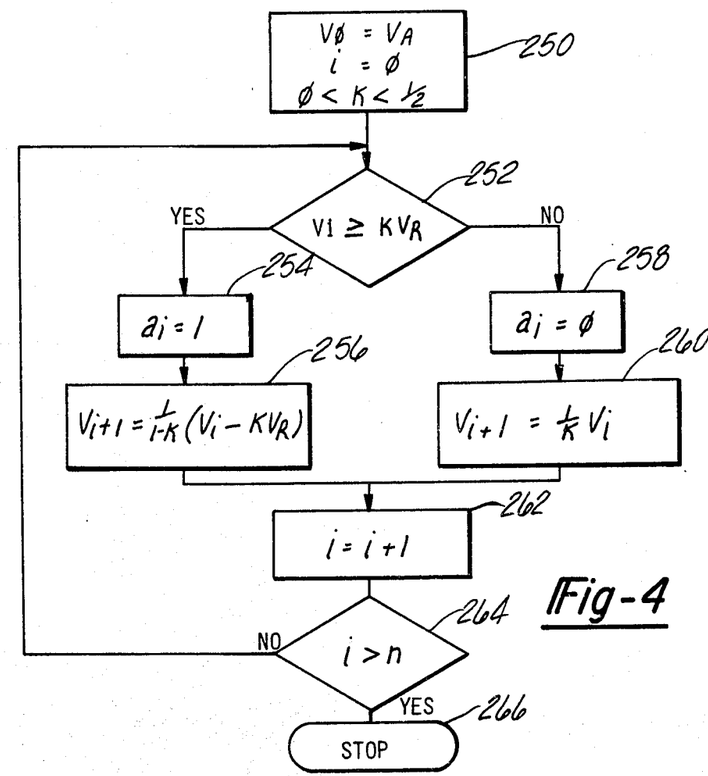
FIG. 4 is a flowchart setting forth the steps involved in an A/D conversion in accordance with the present invention.

With reference to FIG. 4, in step 250, certain variables are initialized preparatory to entering a succession of n conversion cycles. By way of nomenclature, $V_A$ is the actual value of the analog input signal, $V_R$ is the nominal full scale or upper limit value of $V_A$, k is the bit weight constant selected from the range of $0<k<\frac{1}{2}$. The comparison voltage, heretofore designated $V_C$, is now assigned a numerical subscript to correlate it with a cycle number. More specifically $V_O=V_A$, $i=O$, and k is selected to have a specific value within its range of permissible values.

Decision 252 begins an iterative routine that repeats n times, one time for each bit in a digital output word. In decision 252 the comparison voltage $V_i$ for this cycle is compared against $kV_R$.

If the comparison is favorable, the YES path is followed to step 254. In step 254 the digital output bit for this cycle, a, is set equal to a binary one. From step 254 the flow continues to step 256.

In step 256 the comparison voltage for the next succeeding cycle is determined as a function of the condition of the output bit for the present cycle. Specifically, the comparison voltage to the next succeeding cycle is related to the comparison voltage of the preceding cycle as follows:

$$V_{i+1}=(1/(1-k))(V_i-kV_R).$$

If the comparison of decision 252 is unfavorable, the NO path is followed to step 258. In step 258 the digital output bit a for this cycle is set equal to a binary zero. The flow continues from step 258 to step 260. In step 260 the comparison voltage for the next succeeding cycle is determined by the following expression:

$$V_{i+1}=(1/k)V_i.$$

From either of steps 256 and 260 the flow continues to step 262. In step 262 the cycle counter is incremented by one, i.e. i=i+1.

In decision 264, the value of i is compared against n, which is the number of bits in the digital output word and the number of cycles required for conversion. If i is less than or equal to n, the NO path is followed to reenter decision 252. If i exceeds n, the YES path is followed to terminal 266, and the cycle is completed.

V. The D/A Converter Embodying the Present Invention

Figure 7:
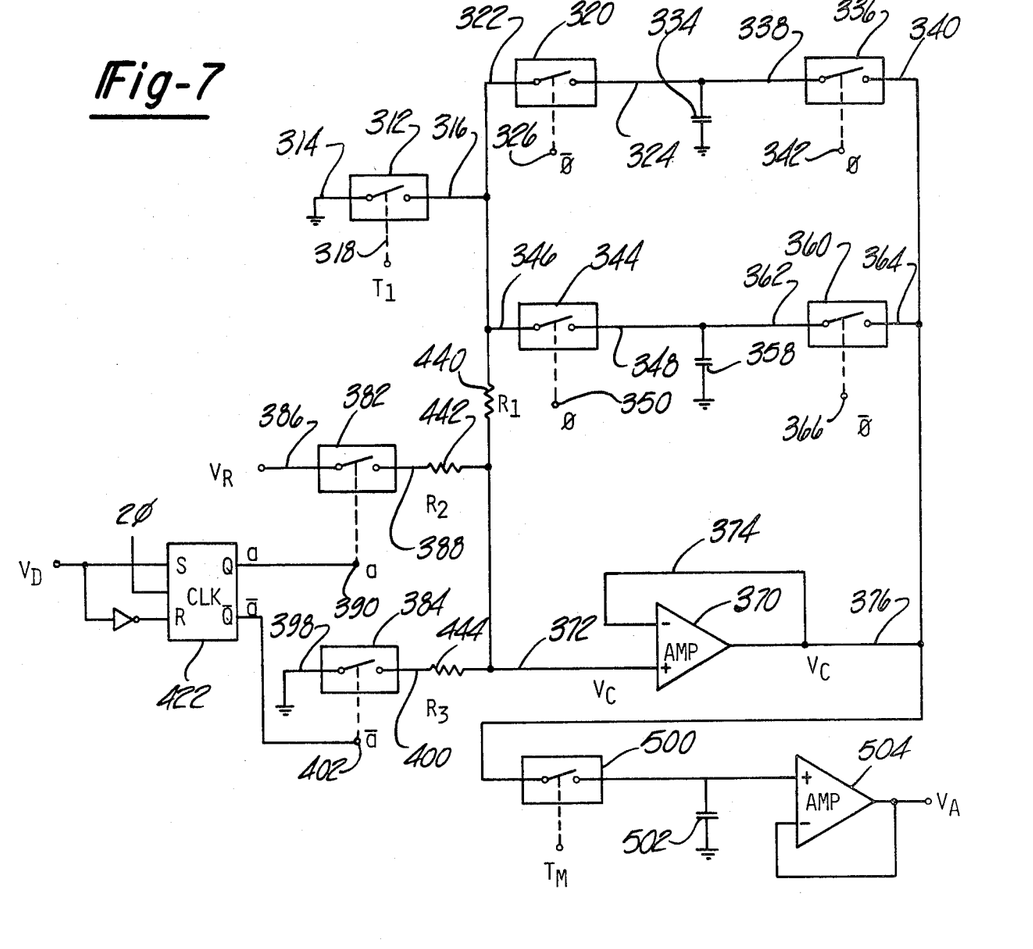
FIG. 7 is a schematic of the companion D/A converter of the present invention.

A serial digital-to-analog converter modified in accordance with the present invention is shown in FIG. 7. The digital to analog converter converts a non-binary input digital word into a corresponding analog output signal $V_A$. The circuit shown in FIG. 7 is a modification of the cyclic digital-to-analog converter shown in FIG. 19 of "An Electronic Design Practical Guide to D/A Conversion" by H. Schmid, *Electronic Design* Oct. 24, 1968 pages 49 through 88. In these cyclic digital-to-analog converters, the digital word is serially input to the converter with the least significant bits first, and the most significant bits last. This is in contrast to the serial analog-to-digital converters which generate the most significant bits first and the least significant bits last.

The modification of the circuit shown in FIG. 7 are analogous to the modifications to the analog-to-digital converter circuit shown on FIG. 2. The modification is primarily directed to the voltage divider network connected to the positive input terminal 372 of amplifier 370. To show the analogy between the two types of converters and their modifications, the components in FIG. 7 which directly correspond to their counterparts of FIG. 2 are shown in the same location and use identifying indicia which are larger by 300, i.e. switch 320 of FIG. 7 corresponds to switch 20 in FIG. 2.

Referring now to FIG. 7, a voltage dividing network comprising resistances 440, 442 and 444 is connected to the positive input terminal 372 of differential amplifier 370. The output of amplifier 370 is connected to its negative input 374. With this arrangement, amplifier 370 has unity gain with its output on terminal 376 being equal to the signal $V_c$ received at its positive input terminal 372. The resistor 440 has an ohmic value $R_1$ and is connected between the positive input terminal 372 of amplifier 370 and terminals 316, 322 and 346 of switches 312, 230 and 344 respectively.

Resistor 442 has an ohmic value $R_2$ and is connected between switch 382 and the positive input terminal 372. In a like manner resistor 444 has an ohmic value $R_3$ and is connected between switch 384 and the positive input terminal 372.

The individual digits of the digital word are received by a J-K Flip Flop 422 which produces signals "a" and its complement "ā" at its Q and Q̄ outputs, respectively, depending upon the value of the received bit. The signal "a" closes switch 382 while its complement "ā" closes switch 384. During each timing period one or the other of the switches 382 or 384 will be closed in accordance with the value of the received digit. When switch 382 is closed, a reference voltage $V_R$ is placed on one end of resistor 442 and a voltage divider is formed by resistors 440 and 442. When switch 384 is closed, one end of resistor 444 is placed at a ground potential and a voltage divider is formed by resistors 440 and 444.

The voltage applied to the end of resistor 440 opposite amplifier 370 is determined by the state of switches 312, 320 and 344. During the first timing period designated $T_1$, switch 312 is closed and the voltage applied to the opposite end of resistor 440 is ground of 0 potential. During each subsequent timing period, designated $\phi$ and $\bar{\phi}$, one or the other of switches 320 or 344 will be closed. The relationship between the timing signal $T_1$, $\phi$, and $\bar{\phi}$ are as shown on FIG. 5. The closing of either switch 320 or 344 couples a stored signal (voltage) $V_p$ produced during the preceding time period and stored on capacitors 344 or 358 to the opposite end of resistor 440.

The ohmic values $R_2$ and $R_3$ of resistors 442 and 444 respectively are determined by the ohmic value of resistor $R_1$ and a bit weight constant k, according to the following relationship:

$$R_2 = ((1-k)/k)R_1$$

and $$R_3 = (k/(1-k))R_1$$

The voltage placed on the positive input terminal 382 of amplifier 370 is thus a function of the value of the input bit. When the input bit is high, the voltage $V_c$ applied to the input terminal 372 is $$V_c = (1-k)V_p + kV_R$$

When the value of the received bit is low, the voltage $V_c$ is $$V_c = kV_p$$

The circuit of FIG. 7 also differs from the circuit of FIG. 2 by the inclusion of the sample and hold circuit comprising Switch 500, capacitance 502 and amplifier 504. Switch 500 samples the voltage $V_c$ at the output of differential amplifier 370 in response to the final timing signal $T_N$. For example if the received digital word has 12 digits, $T_{N=T12}$ or if the digital word has 8 digits, $T_{N=T8}$. The sampled voltage $V_c$ is stored in capacitor 502. Amplifier 504 has its output connected to its negative input to produce a unity gain transfer of the sampled voltage $V_c$ on capacitor 502 to the converter output. The output of ampifier 504 is the analog output signal $V_A$ which has a value equal to the value of the final output signal $V_c$ of amplifier 370.

The switches 336 and 360 transfer the output signal $V_c$ of amplifier 370 to capacitors 334 and 358 in an alternating sequence in response to the timing signals $\phi$ and $\bar{\phi}$ respectively, as previously discussed with reference to the analog-to-digital converter of FIG. 2.

The operation of the digital-to-analog converter will be explained by way of example decoding the non-binary digital word representing a value of 3 volts. In the description of the operation of the analog-to-digital converter, the non-binary digital word corresponding to 3 volts, where the value of k was ¼, was 101001.

Inputting this word into the digital-to-analog converter starting with the least significant bit as previously indicated the operation of the converter is as follows.

Starting with the least significant or 6th bit, the operation of the non-binary digital to analog converter is as follows:

For the first least significant bit, switches 312 is closed and switches 320 and 344 are open therefor $V_P=$. When the input bit is high (1) switch 382 is closed and switch 384 is open, thus $V_C=(1-k)V_P+kV_R=0+2.5=2.5$ volts.

The next or 5th bit is low (0), therefore switch 382 opens and switch 384 closes. Switch 312 which is only closed for the first timing period opens. The output $V_C$ of amplifier 370 is given by $V_C=kV_P=\frac{1}{4}\times 2.5=0.625$ volts where $V_p$ has the value of $V_c$ from the preceding cycle.

The fourth bit again is low so switch 382 remains open and switch remains 384 closed. The output $V_C$ of amplifier 370 is $V_C=kV_P=\frac{1}{4}\times 0.625=0.156$ volts.

The third bit is high, therefore $V_C=(1-k)V_P+kV_P=\frac{3}{4}\times 0.156+2.5=2.617$ volts.

The second bit is again low, therefore $V_C=kV_P=\frac{1}{4}\times 2.616=0.654$ volts.

The first bit is again high, therefore $V_C=(1-k)V_P+kV_R=\frac{3}{4}\times 0.654+2.5=0.49+2.5=2.99$ volts.

The analog output of the converter is the final voltage $V_C$, therefore, the output of the converter in response to the non-binary digital word 101001 is 2.99 volts. The error is 0.01 volts or approximately 0.3% of the input signal. It is thus seen that the disclosed non-binary A/D and D/A converters have significantly improved conversion accuracy over the binary converters of the prior art.

Figure 8:
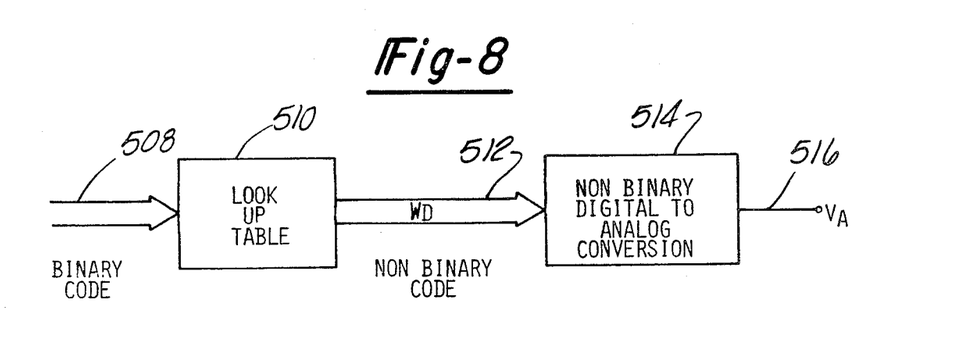
FIG. 8 is a block diagram of a D/A converter of the present invention in conjunction with a look-up table for translating a binary code into a corresponding non-binary code.

In a manner similar to that discussed with reference to the analog-to-digital converter, the digital to analog converter of FIG. 7 may be preceded by a binary digital to non-binary digital converter device in the form of a look-up table or storage array such as a read only memory (ROM) 510 as illustrated in FIG. 8. The read only memory 510 is addressed by a received binary digital word 508 and outputs a corresponding non-binary word 512. The output non-binary word 512 is received by the non-binary digital-to-analog converter 514 and converted to an equivalent analog signal $V_a$ at its output 516.

The advantages of converting the binary word to a non-binary word prior to converting to an analog signal are two fold. First, the non-binary conversion has increased conversion accuracy over a straight forward binary conversion. Secondly, the relationship between the ohmic values of resistors $R_1$, $R_2$ and $R_3$ in the digital-to-analog converter may not be exact due to manufacturing tolerances, causing an error in the respective output signals. Compensation for these types of errors may be achieved in the binary to non-binary conversion when they are known. For instance, the non-binary digital-to-analog converter will have a desired analog output signal which corresponds to each received binary word. The non-binary word which will cause to digital to analog converter to output the desired signal can be determined by experimental methods, or calculated from the known values of the resistors using well known methods or techniques. The non binary word which causes the digital-to-analog converter to output the corresponding desired analog signal can then be stoed at the address defined by the corresponding binary word in the look up table 510.

This ability to correct for error in the ohmic values of the resistances in or other errors the converters, permit the disclosed analog-to-digital converter, or the disclosed digital-to-analog converter to be fabricated using large scale integration (LSI) manufacturing methods which do not require the costly procedure of trimming of the values of the individual resistors to precise values. The result is a more accurate conversion device, which is easier to manufacture and thereby less costly than comparable devices presently available on the commercial market.

As with the analog-to-digital converter of FIG. 6, the storage array 510 preceding the digital to analog converter may convert a received non-binary word to a corrected non-binary word compensating for inaccuracies in the conversion process. In a matched pair system using an analog-to-digital converter back-to-back with a digital to analog converter, it is obvious only one storage array 250 or 510 would be required.

It is not intended that the invention be limited to the serial analog-to-digital and serial digital-to-analog converters as disclosed and described herein. It would be obvious to one skilled in the art to apply the teachings herein to parallel analog-to-digital and digital-to-analog converters without departing from the spirit of the invention.

What is claimed is:

1. A method for converting a non-binary digital word to an analog signal comprising the steps of:
   repetitively generating a predetermined set of timing signals in response to clock signals received from an external source;
   decoding a received non-binary digital word to serially generate bit value signals having a first value when the received bit is high and a second value when the received bit is low;
   generating an initial feedback signal $V_p$ having a predetermined value in response to only the first timing signal in each set of timing signals;
   generating a comparison signal $V_c$ in response to said timing signals, a feedback signal $V_p$, a reference signal $V_R$, and said bit value signals, said comparison signal having a value $$V_c=(1-k)V_p+kV_r$$

when said bit value signal has said first value, and generating said comparison signal $V_c$ having a value $$V_c=kV_p$$

when said bit value signal has said second value, wherein k has a predetermined value in the range of $0<k<\frac{1}{2}$, and $V_R$ is a reference signal having a value equal to the full scale value of the analog signal;
   storing said comparison signal $V_c$ to generate said feedback signal $V_p$ for use in the generation of the next sequential comparison signal $V_c$;
   repeating said steps of generating and storing said comparison signal in response to the remaining timing signals in said set of timing signals using the stored feedback signal $V_p$; and
   outputting said comparison signal $V_c$ in response to the last timing signal in each set of timing signals to generate an analog output signal having a value corresponding to the value of the received non-binary digital word.

2. The method of claim 1 wherein the predetermined value of said initial feedback signal generated in response to said first timing signal is indicative of a common ground and has a value equal to zero.

3. The method of claim 1 wherein said step of generating a comparison signal $V_c$ comprises the steps of:

transmitting said feedback signal $V_p$ to the input of a unity gain amplifier through a first resistance $R_1$ having a predetermined value;

transmitting said reference signal $V_R$ to the input of said unity gain amplifier through a second resistance $R_2$ in response to said bit value signal having said first value, said second resistance having a value related to the value of resistance $R_1$ according to the equation $$R_2 = ((1-k)/k)R_1$$

transmitting a ground potential to the input of said unity gain amplifier through a third resistance $R_3$ in response to said bit value signal having said second value, said third resistance $R_3$ having a value related to the value of said first resistance $R_1$ according to the equation $$R_3 = (k/(1-k))R_1$$

and amplifying the composite signal received at the input of said unity gain amplifier to generate said comparison signal $V_c$.

4. The method of claim 3 wherein said received digital word is a binary digital word, said method further preceded by the step of converting said binary digital word to a non-binary digital word.

5. The method of claim 3 wherein said step of generating a comparison signal requires a precise relationship between the values of resistances $R_1$, $R_2$, and $R_3$ and wherein the actual relationship between resistances $R_1$, $R_2$, and $R_3$ differ from said precise relationship causing the actual output signal to differ from the corresponding output analog signal, said method further preceded by the steps of:

determining from the actual relationship between resistances $R_1$, $R_2$, and $R_3$, a corrected non-binary word which will produce said corresponding output analog signal;

storing said corrected non-binary words in predetermined storage locations of an addressable storage array, the address of each corrected non-binary word being defined by the non-binary word corresponding to the output analog signal;

addressing said addressable storage array with the received non-binary digital word to output the corrected non-binary word for subsequent conversion to the corresponding output analog signal.

6. The method of claim 4 wherein the step of converting comprises the steps of:

storing a set of non-binary words in predetermined storage locations in an addressable storage array, the address of each non-binary word being defined by the corresponding digital word; and addressing said addressable storage array with said binary word to output said non-binary word.

7. The method of claim 6 wherein said step of generating a comparison signal requires a precise relationship between the values of resistances $R_1$, $R_2$, and $R_3$ and wherein the actual relationship of resistances $R_1$, $R_2$ and $R_3$ differ from said precise relationship causing the actual output analog signal to differ from the desired analog signal, said step of converting said binary word further includes the steps of:

determining from the actual relationship between resistances $R_1$, $R_2$, and $R_3$, a corrected non-binary word which will produce said corresponding output analog signal; and wherein said step of storing said non-binary words stores said corrected non-binary words in predetermined storage locations, the addresses of which are determined by the corresponding binary words.

8. The method of claim 1 wherein said received digital word is a binary digital word having a binary format, said method further includes the step of converting said binary word to a corresponding non-binary word prior to converting the non-binary word to a corresponding analog signal.

9. The method of claim 8 wherein said step of converting comprises the steps of:

storing a set of non-binary words in predetermined storage locations in an addressable storage array, the address of the predetermined storage locations being defined by the corresponding binary word;

addressing said addressable storage array with the received binary word to output the corresponding non-binary word.

10. The method of claim 9 wherein said step of generating a comparison signal requires a precise relationship between predetermined elements to produce the corresponding analog signal and wherein the actual relationship between the predetermined elements differ from the precise relationship causing an error in the output analog signal, said method further includes the steps of:

determining from the actual relationship between said predetermined elements the non-binary word corresponding to the analog signal represented by each binary word; and wherein said step of storing a set of non-binary words stores the determined non-binary words in the storage locations defined by the corresponding binary word.

11. The method of claim 1 wherein said step of generating a comparison signal requires a precise relationship between predetermined elements and wherein the actual relationship between said predetermined elements differs from said precise relationship causing the actual output analog signal to differ from the desired output analog signal, said method further includes the steps of:

determining from the actual relationship between said predetermined elements a corrected non-binary word which will produce said corresponding output analog signal;

storing said corrected non-binary words in predetermined storage locations in an addressable storage array, the address of said corrected binary words being determined by the corresponding non-binary word; and addressing said addressable storage array with said corresponding non-binary word to output said corrected non-binary word for subsequent conversion into an analog signal.

12. A non-binary digital to analog signal converter comprising:

timing signal generator means for repetitively generating a set of timing signals in response to clock signals received from an external clock;

decoder means for serially generating bit value signals in response to each bit of a received non-binary word, said bit value signal having a first value when the received bit is high and a second value when the received bit is low;

means for generating an initial feedback signal $V_p$ having a predetermined value in response to the first timing signal of each set of timing signals;

means for generating a comparison signal $V_c$ in response to said timing signals, said feedback signal $V_p$, a reference signal $V_R$, and said bit value signals, said comparison signal $V_c$ having a first value $$V_c=(1-k)V_p+kV_R$$

when said bit value signal has said first value and a second value $$V_c=kV_p$$

when said bit value signal has said second value; wherein k has a predetermined value in the range from $0<k<\frac{1}{2}$, and $V_R$ is said reference signal having a value equal to the full scale value of the analog signal;

means for temporarily storing the value of said comparison signal $V_c$ to generate a feedback signal $V_p$ in response to said timing signals, said means for temporarily storing further responsive to the next sequential timing signal for outputting said stored feedback signal $V_p$ to said means for generating a comparison signal $V_c$; and means for outputting the last generated comparison signal $V_c$ in response to the last timing signal in each set of timing signals;

where the value of said last comparison signal generated during each set of timing signals is said analog signal.

13. The converter of claim 12 wherein the predetermined value of the feedback signal generated by said initial feedback signal generator means is indicative of a common ground.

14. The converter of claim 14 wherein said means for generating said comparison signal $V_c$ comprises:
 a unitary gain amplifier having an input and an output connected to said means for temporarily storing said comparison signal $V_c$ and said means for outputting;
 a first resistance $R_1$ having a predetermined value connected between said means for generating a first feedback signal $V_p$ and the input of said operational amplifier;
 means for generating said reference signal $V_R$ in response to said bit value having said first value;
 a second resistance $R_2$ connecting said means for generating said reference signal $V_R$ to the input of said unity gain amplifier, said second resistance $R_2$ having an ohmic value related to the ohmic value of said first resistance $R_1$ according to the equation $$R_2=((1-k)/k)R_1$$

means for generating a ground signal in response to said bit value signals having said second value;
a third resistance $R_3$ connected between said means for generating a ground signal and the input of said unity gain amplifier, said third resistance $R_3$ having an ohmic value related to the value of said first resistance $R_1$ by the equation $$R_3=(k/(1-k))R_1$$

15. The converter of claim 14 wherein the received digital word is a binary digital word, said converter further includes means preceding said non-binary digital to analog converter for converting said binary digital word to a corresponding non-binary digital word.

16. The converter of claim 15 wherein said means for converting is an addressable storage array storing a corresponding set of non-binary digital words in predetermined storage locations, the address of each stored non-binary word being defined in terms of its corresponding binary digital word.

17. The converter of claim 16 wherein the ohmic values of resistances $R_2$ and $R_3$ differ from the desired relationship with respect to resistance $R_1$ causing the generated analog signal to differ from a desired analog signal, said converter further includes an addressable storage array preceding the non-binary to analog converter for storing non-binary words corresponding to the desired analog signals in address locations defined by received non-binary word.

18. The converter of claim 12 wherein the received digital word is a binary digital word, and said converter further includes means preceding said non-binary digital to analog converter for converting said binary digital word to a corresponding non-binary digital word.

19. The converter of claim 18 wherein said means for converting is an addressable storage array storing a corresponding set of non-binary digital words in predetermined storage locations, the address of each stored non-binary word being defined in terms of its corresponding binary word.

20. The converter of claim 19 wherein said addressable storage array is a read only memory.

21. The converter of claim 19 wherein said feedback signal generator includes elements which must have a precise relationship to each other in order to generate the desired analog signal, and where any errors in said precise relationship between said elements will cause the generated analog signal to differ from the desired analog signal, and said addressable storage array stores non-binary digital words corresponding to the desired analog signals in the address locations defined by the received binary words.

22. The converter of claim 21 wherein the received digital word is a binary word, said non-binary to digital converter further includes an addressable storage array storing a corresponding set of non-binary digital words in predetermined storage locations, the address of each non-binary digital word being defined in terms of its corresponding binary digital word.

23. The converter of claim 22 wherein the ohmic value of resistances $R_1$ and $R_2$ differ from the desired relationship to resistance $R_1$ causing the generated analog signal to differ from the desired analog signal, said addressable storage array stores the non-binary word corresponding to the desired analog signal in the address locations defined by the received bindary digital word.

24. The converter of claims 23 or 22 wherein said addressable array is a read only memory.

* * * * *